(12) United States Patent
Lu

(10) Patent No.: US 10,617,024 B2
(45) Date of Patent: Apr. 7, 2020

(54) LOCKING SPRING STRUCTURE AND POWER APPARATUS HAVING THE SAME

(71) Applicant: 3Y POWER TECHNOLOGY (TAIWAN), INC., Taoyuan (TW)

(72) Inventor: Shao-Feng Lu, Taoyuan (TW)

(73) Assignee: 3Y POWER TECHNOLOGY (TAIWAN), INC., Taoyuan (TW)

( * ) Notice: Subject to any disclaimer, the term of this patent is extended or adjusted under 35 U.S.C. 154(b) by 0 days.

(21) Appl. No.: 16/174,303

(22) Filed: Oct. 30, 2018

(65) Prior Publication Data

US 2019/0132967 A1    May 2, 2019

(30) Foreign Application Priority Data

Oct. 30, 2017   (CN) .......................... 2017 1 1041036

(51) Int. Cl.
*H05K 5/02* (2006.01)
*H05K 5/03* (2006.01)

(52) U.S. Cl.
CPC ......... *H05K 5/0204* (2013.01); *H05K 5/0221* (2013.01); *H05K 5/03* (2013.01)

(58) Field of Classification Search
CPC ...... H05K 5/0204; H05K 5/0221; H05K 5/03; H05K 5/02; H05K 5/0208; H05K 5/0217; H05K 5/0021; H05K 5/0023; H05K 7/1413; H05K 5/0247; H05K 5/0256; H05K 7/1411; H05H 7/1412; H01R 33/97; G06F 1/188; G06F 1/189; G06F 1/184; G11B 33/127

USPC .... 174/50, 520, 61, 535, 542; 361/727, 726, 361/725, 796, 679.31; 312/223.1, 223.2, 312/223.3, 223.6

See application file for complete search history.

(56) References Cited

U.S. PATENT DOCUMENTS

| | | | | |
|---|---|---|---|---|
| 4,659,159 A | * | 4/1987 | Takahashi | H05K 5/0204 361/679.58 |
| 5,584,396 A | * | 12/1996 | Schmitt | H02B 1/36 211/26 |
| 8,824,149 B2 | * | 9/2014 | Wang | G06F 1/188 361/272 |
| 9,801,296 B1 | * | 10/2017 | Wu | H05K 5/0221 |
| 10,165,696 B1 | * | 12/2018 | Blasingame | H05K 5/0221 |
| 2009/0080165 A1 | * | 3/2009 | Barina | H05K 7/1411 361/747 |
| 2009/0139281 A1 | * | 6/2009 | Chen | E05B 65/006 70/63 |

(Continued)

*Primary Examiner* — Daniel P Wicklund
*Assistant Examiner* — Christopher L Augustin
(74) *Attorney, Agent, or Firm* — JCIPRNET

(57) ABSTRACT

A power apparatus including a housing, a fixing bracket and a locking spring structure is provided. The fixing bracket is detachably fixed to an outer side of the housing. The locking spring structure includes a first elastic piece, a second elastic piece and a fixing member. One end of the first elastic piece is fixed to an inner side of the housing, and the other end of the first elastic piece extends outward to the outer side of the housing. The first elastic piece has a first tenon located outside the housing. The second elastic piece is installed between the housing and the fixing bracket, and is detachably fixed to the first elastic piece by the fixing member. The second elastic piece has a second tenon located outside the fixing bracket.

17 Claims, 8 Drawing Sheets

(56) References Cited

U.S. PATENT DOCUMENTS

| | | | | |
|---|---|---|---|---|
| 2011/0242768 A1* | 10/2011 | Lu | ............................ | H05K 5/023 |
| | | | | 361/726 |
| 2013/0094156 A1* | 4/2013 | Wang | ........................ | G06F 1/188 |
| | | | | 361/747 |
| 2013/0106261 A1* | 5/2013 | Kuan | ..................... | H05K 5/0221 |
| | | | | 312/223.1 |
| 2013/0108358 A1* | 5/2013 | Lin | ........................ | H05K 5/0221 |
| | | | | 403/322.4 |
| 2013/0342979 A1* | 12/2013 | Chen | ........................ | H02J 1/00 |
| | | | | 361/679.01 |
| 2015/0351277 A1* | 12/2015 | Frank | ..................... | H05K 7/1489 |
| | | | | 361/679.33 |
| 2016/0338218 A1* | 11/2016 | Yang | ..................... | H05K 7/1489 |

\* cited by examiner

LOCKING SPRING STRUCTURE AND POWER APPARATUS HAVING THE SAME

CROSS-REFERENCE TO RELATED APPLICATION

This application claims the priority benefit of China application serial no. 201711041036.4, filed on Oct. 30, 2017. The entirety of the above-mentioned patent application is hereby incorporated by reference herein and made a part of this specification.

BACKGROUND OF THE INVENTION

Field of the Invention

The invention relates to a power apparatus, and particularly relates to a power apparatus that may be installed to and engaged with chassis of different sizes.

Description of Related Art

In a typical backup power supply or a power supply having great power, there are usually more than two power supplies that supply power alternately. Therefore, several power supplies that supply power alternately are usually placed in a single chassis. However, since each customer has different need, the size of the chassis changes accordingly, and in order to meet the size of the chassis, mold retooling is required for the housing of the power supply to facilitate easy placement into the chassis. As a result, production costs are increased and the development schedule is prolonged.

Referring to FIGS. 1 and 2, in a conventional power supply, a locking spring 2' is disposed inside a side plate 11' of a housing 1' so that the power supply may be fixed to the chassis (not shown) or detached from the chassis by pressing the locking spring 2'. The locking spring 2' includes a spring 20', and the spring 20' is provided with a tenon 21' thereon for locking onto the chassis. One end of the spring 20' exposing the housing 1' is a movable end 22', and the other end of the spring 20' is a fixing end 23'. The fixing end 23' is fixed to the inner side of the housing 1' by means of riveting. However, this kind of single spring is only adapted to be fixed to chassis of one single size, and may not be fixed to chassis of different sizes as required. Therefore, it is necessary to provide a power apparatus that may be installed to chassis of different sizes without requiring mold retooling s and that may be locked to the chassis via a locking spring structure thereof.

SUMMARY OF THE INVENTION

The invention further provides a locking spring structure by which the power supply may be installed and locked to chassis of different sizes without requiring mold retooling.

The invention provides a power apparatus by which the power supply may be installed and locked to chassis of different sizes without requiring mold retooling.

In view of the foregoing purposes, an embodiment of the invention provides a locking spring structure adapted for a power apparatus. The power apparatus further includes a housing and a fixing bracket, and the fixing bracket is detachably fixed to an outer side of the housing. The locking spring structure includes a first elastic piece, a second elastic piece and a fixing member. One end of the first elastic piece is fixed to an inner side of the housing, and the other end of the first elastic piece extends outward to the outer side of the housing. The first elastic piece has a first tenon located outside the housing. The second elastic piece is installed between the housing and the fixing bracket and is detachably fixed to the first elastic piece by the fixing member. The second elastic piece has a second tenon located outside the fixing bracket. As the other end of the first elastic piece is moved inward, the first elastic piece and the second elastic piece are driven to be elastically deformed inward, so that the first tenon and the second tenon are moved inward.

Compared with existing technology, the locking spring structure of the invention is installed to the housing and the fixing bracket. The second elastic piece is installed between the housing and the fixing bracket and is detachably fixed to the first elastic piece by the fixing member. The second elastic piece has a second tenon located outside the fixing bracket. As the other end of the first elastic piece is moved inward, the first elastic piece and the second elastic piece are driven to be elastically deformed inward, so that the first tenon and the second tenon are moved inward. With the foregoing design, when the power supply is required to be installed to a chassis of a larger size, it is only necessary to combine the locking spring structure and the fixing bracket onto the housing to achieve smooth installation and locking, and when the power supply is required to be installed back to the original chassis or be installed to a replacement chassis, it is only necessary to detach the second elastic piece and the fixing bracket of the locking spring structure. Since there is no need to design a new housing adapted for the power supply in response to a variety of chassis of larger sizes, time for mold retooling and production costs are saved. Besides, the entire process does not require disassembling the power supply, and is thus simple and convenient.

Preferably, the fixing member is a linking screw, and the linking screw is inserted through the first elastic piece and the second elastic piece to achieve the purpose of detachably fixing the second elastic piece to the first elastic piece conveniently.

Preferably, the housing includes a side plate, a top plate and an endcap, and the top plate and the endcap are adjacent to the side plate and an endcap. The fixing bracket has a base plate fixed to an outer side of the side plate. The first elastic piece has a first elastic arm. One end of the first elastic arm is fixed on an inner wall of the side plate, and the other end of the first elastic arm forms the first tenon protruding outward; the first tenon is located outside the side plate. The other end of the first elastic piece extends outward from the endcap. The second elastic piece has a second elastic arm disposed between the side plate and the base plate. The second tenon protrudes outward from one end of the second elastic arm and is located outside the base plate.

Preferably, an opening aligned with the first tenon is formed on the second elastic arm to provide an evading space for the first tenon.

Preferably, the other end of the second elastic arms is fixed to an inner wall of the base plate. In this way, not only does the second elastic arm provide an inward elastic force more easily, but it is also more convenient, during the assembly, to install the second elastic piece together with the fixing bracket on the housing, or to detach the second elastic piece together with the fixing bracket from the housing.

Preferably, a notch is formed on the base plate. The second elastic arm has a fixing end fixed to the inner wall of the base plate, a movable end located at the notch of the base plate, and a bent portion connecting the fixing end with the movable end. Due to the cooperation between the notch and the movable end, when the second tenon is pushed inward, the space for the movable end to be elastically deformed inward may be increased.

Preferably, a top portion of the other end of the first elastic arm extends inward and then extends toward the endcap to form a first connecting plate substantially adjacent to and parallel to the top plate. An end of the first connecting plate extends outward to be out of the endcap. A top portion of the second elastic arm extends inward to be out of a second connecting plate that passes through the side plate to reach the inner side of the housing and is aligned with the first connecting plate. The first connecting plate is provided with a first screw hole and the second connecting plate is provided with a second screw hole corresponding to the first screw hole, and the first screw hole and the second screw hole are configured for the linking screw to be locked. By the cooperation with the corresponding through hole provided on the top plate, the second elastic piece may be fixed to the first elastic piece via the linking screw without the need to disassemble the power supply.

In view of another aspect of the foregoing purposes, an embodiment of the invention provides a power apparatus that includes a housing, a fixing bracket and a locking spring structure. The fixing bracket is detachably fixed to an outer side of the housing. The locking spring structure includes a first elastic piece, a second elastic piece and a fixing member. One end of the first elastic piece is fixed to an inner side of the housing, and the other end of the first elastic piece extends outward to the outer side of the housing. The first elastic piece has a first tenon located outside the housing. The second elastic piece is installed between the housing and the fixing bracket and is detachably fixed to the first elastic piece by the fixing member. The second elastic piece has a second tenon located outside the fixing bracket. As the other end of the first elastic piece is moved inward, the first elastic piece and the second elastic piece are driven to be elastically deformed inward, so that the first tenon and the second tenon are moved inward.

Compared with existing technology, the fixing bracket of the invention is detachably fixed to an outer side of the housing. The second elastic piece is installed between the housing and the fixing bracket and is detachably fixed to the first elastic piece by the fixing member. The second elastic piece has a second tenon located outside the fixing bracket. As the other end of the first elastic piece is moved inward, the first elastic piece and the second elastic piece are driven to be elastically deformed inward, so that the first tenon and the second tenon are moved inward. With the foregoing design, when the power supply is required to be installed to a chassis of a larger size, it is only necessary to install the corresponding fixing bracket and the second elastic piece onto the power supply, and when the power supply is required to be installed back to the original chassis or be installed to a replacement chassis, it is only necessary to detach the fixing bracket and the second elastic piece. Since there is no need to design a new housing adapted for the power supply in response to a variety of chassis of larger sizes, time for mold retooling and production costs are saved. Besides, the entire process does not require disassembling the power supply, and is thus simple and convenient.

Preferably, the housing includes a side plate, a top plate and an endcap, and the top plate and the endcap are adjacent to the side plate and an endcap. The fixing bracket has a base plate fixed to an outer side of the side plate. The first elastic piece has a first elastic arm. One end of the first elastic arm is fixed on an inner wall of the side plate, and the other end of the first elastic arm forms the first tenon protruding outward; the first tenon is located outside the side plate. The other end of the first elastic piece extends outward from the endcap. The second elastic piece has a second elastic arm disposed between the side plate and the base plate. The second tenon protrudes outward from one end of the second elastic arm and is located outside the base plate.

Preferably, the second elastic arm and the side plate are spaced apart from each other to provide a space for the second elastic arm to be elastically deformed inward.

Preferably, the other end of the second elastic arm is fixed to an inner wall of the base plate. In this way, not only does the second elastic arm provide an inward elastic force more easily, but it is also more convenient, during the assembly, to install the second elastic piece together with the fixing bracket on the housing, or to detach the second elastic piece together with the fixing bracket from the housing.

Preferably, one end of the second elastic arm is riveted and fixed to an inner wall of the base plate.

Preferably, a notch is formed on the base plate. The second elastic arm has a fixing end fixed to the inner wall of the base plate, a movable end located at the notch of the base plate, and a bent portion connecting the fixing end with the movable end. Due to the cooperation between the notch and the movable end, when the second tenon is pushed inward, the space for the movable end to be elastically deformed inward may be increased.

Preferably, a top portion of the other end of the first elastic arm extends inward and then extends toward the endcap to form a first connecting plate substantially adjacent to and parallel to the top plate. An end of the first connecting plate extends outward to be out of the endcap. A top portion of the second elastic arm extends inward to be out of a second connecting plate that passes through the side plate to reach the inner side of the housing and is aligned with the first connecting plate. The first connecting plate is provided with a first screw hole and the second connecting plate is provided with a second screw hole corresponding to the first screw hole, and the first screw hole and the second screw hole are configured to cooperates with a linking screw. The top plate is provided with a through hole that is corresponding to the first screw hole and the second screw hole, and is configured for the linking screw to pass through. As a result, during the assembly of the second elastic piece, the linking screw may be assembled directly via the through hole on the top plate so as to be locked in the screw hole of the first connecting plate and the screw hole of the second connecting plate. Accordingly, the second elastic piece may be fixed to the first elastic piece via the linking screw without the need to disassemble the power supply.

Preferably, the second connecting plate is located between the first connecting plate and the top plate.

Preferably, the base plate and the side plate are fixed together by a plurality of fixing screws.

Preferably, the housing includes two side plates opposite to each other. The number of the fixing bracket is two, and an outer side of each of the two side plates is fixed with one of the two fixing brackets; at least one of the two side plates is fixed with the locking spring structure; the two fixing brackets are manufactured in a common mold so as to save the cost of mold retooling.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

In order to explain the technical contents, structural features and effects of the invention more clearly, exemplary embodiments are described in detail hereinafter with reference to the figures.

Figure 1:
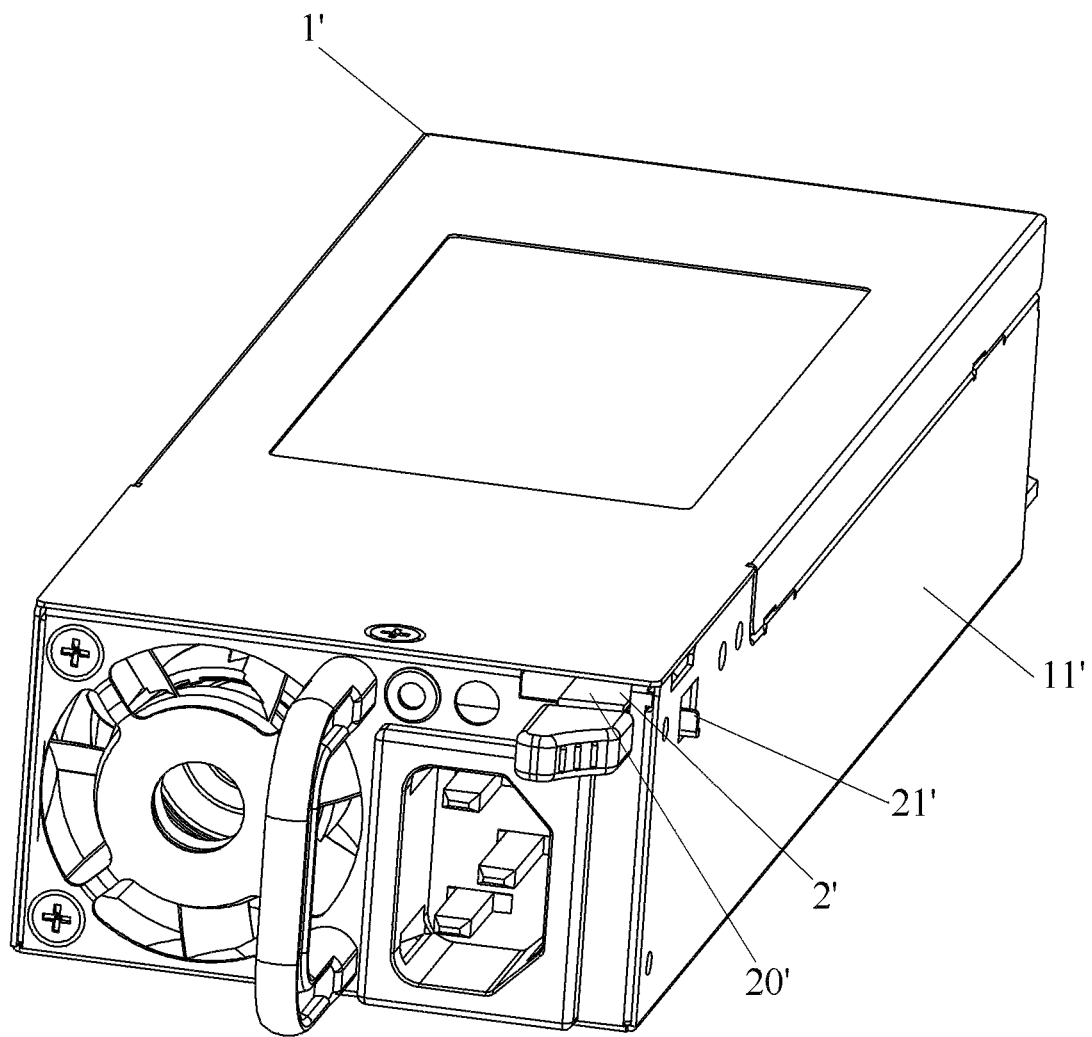
FIG. 1 is a schematic three-dimensional view of a conventional power supply.
Figure 2:
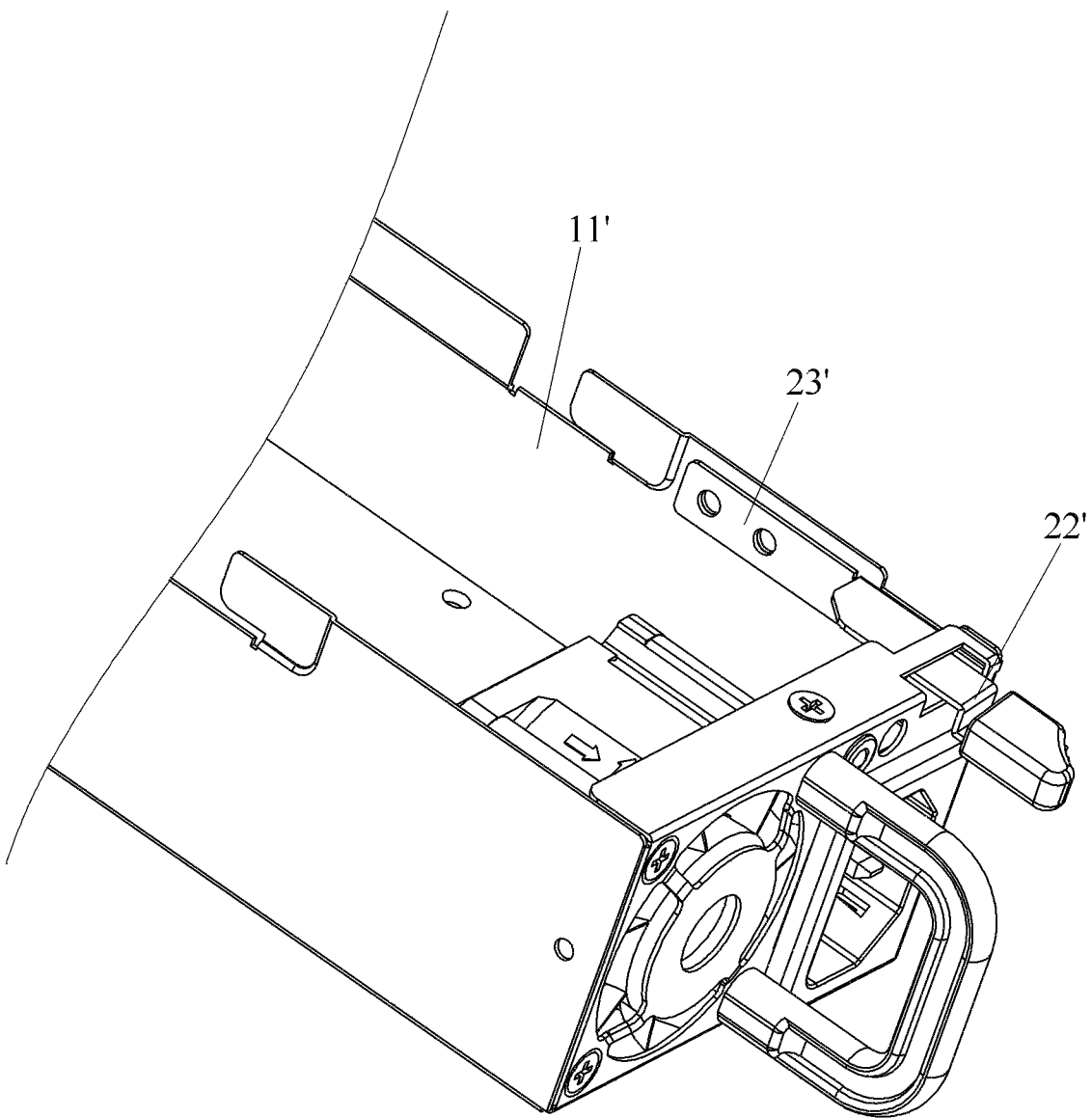
FIG. 2 is a schematic three-dimensional view showing a portion of the power supply of FIG. 1 without the top plate from another perspective.
Figure 3:
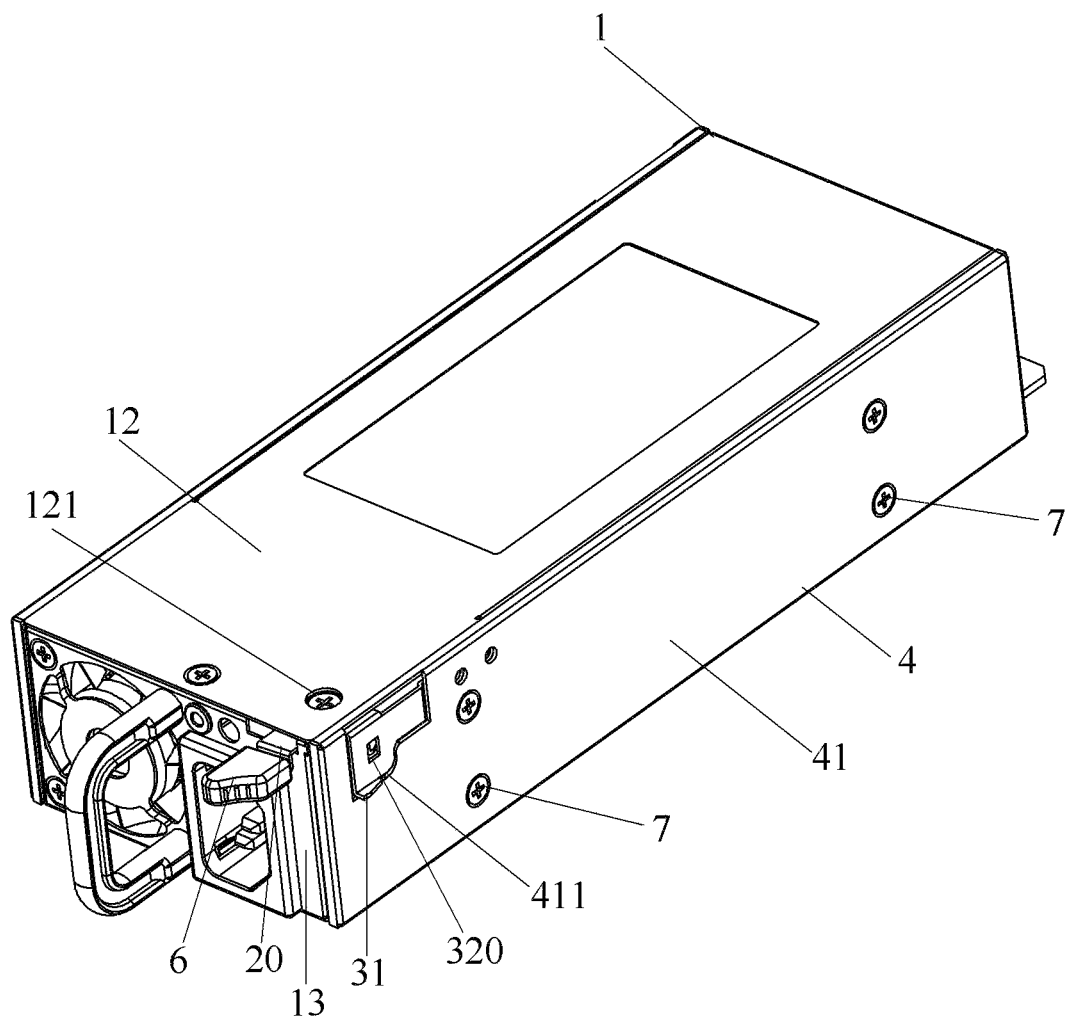
FIG. 3 is a schematic three-dimensional view of a power apparatus according to an embodiment of the invention.
Figure 4:
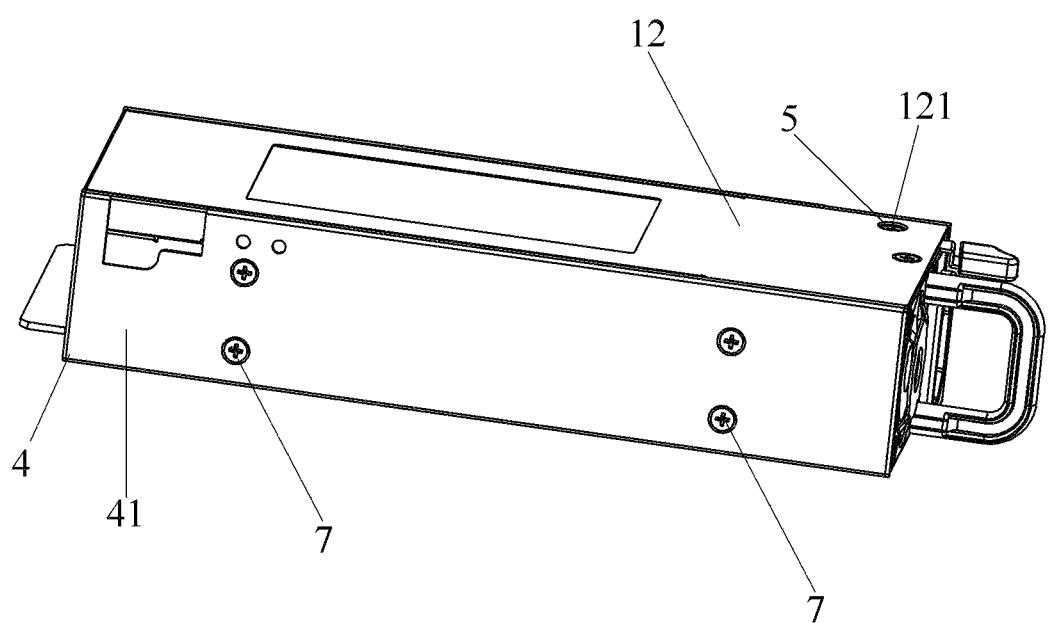
FIG. 4 is a schematic three-dimensional view of the power supply of FIG. 3 from another perspective.
Figure 5:
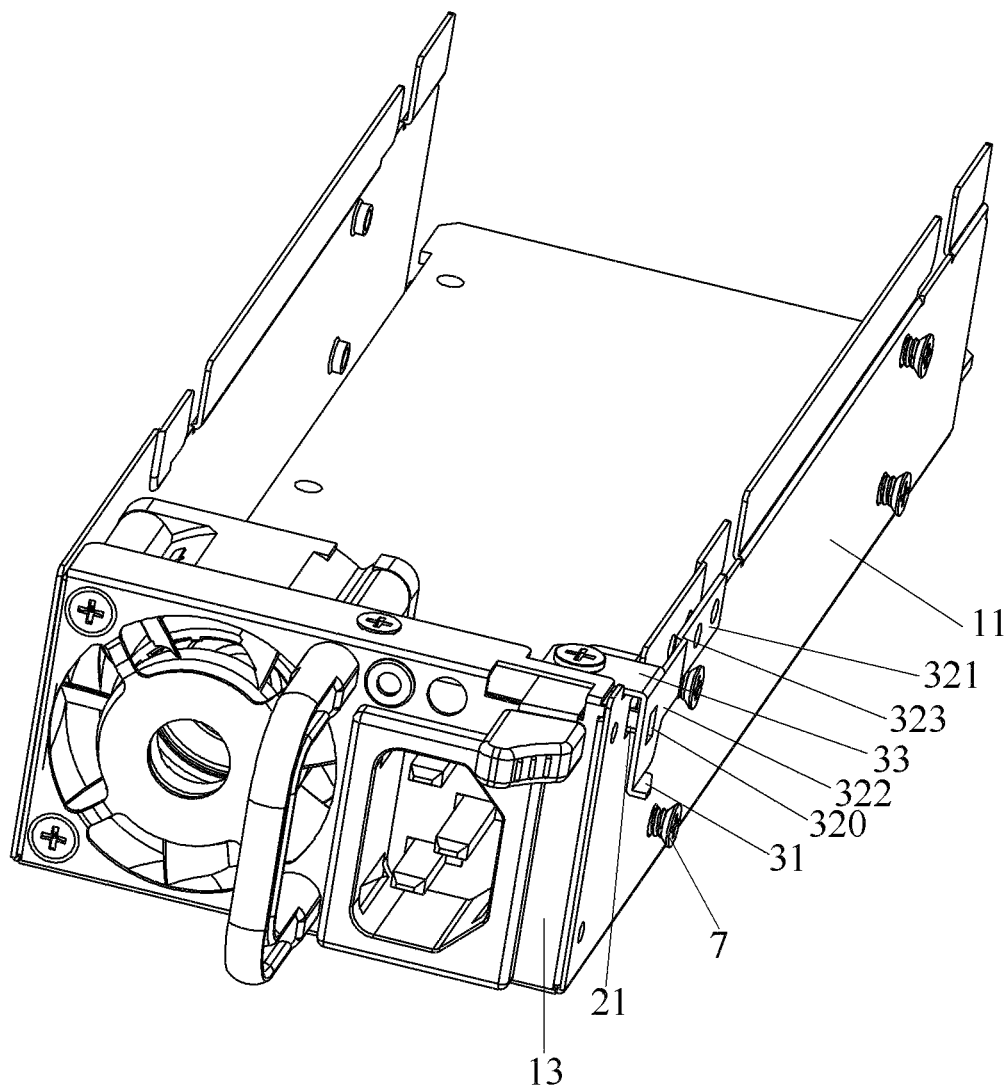
FIG. 5 is a schematic three-dimensional view showing the combination of the second elastic piece and the power supply, wherein the top plate is omitted.
Figure 6:
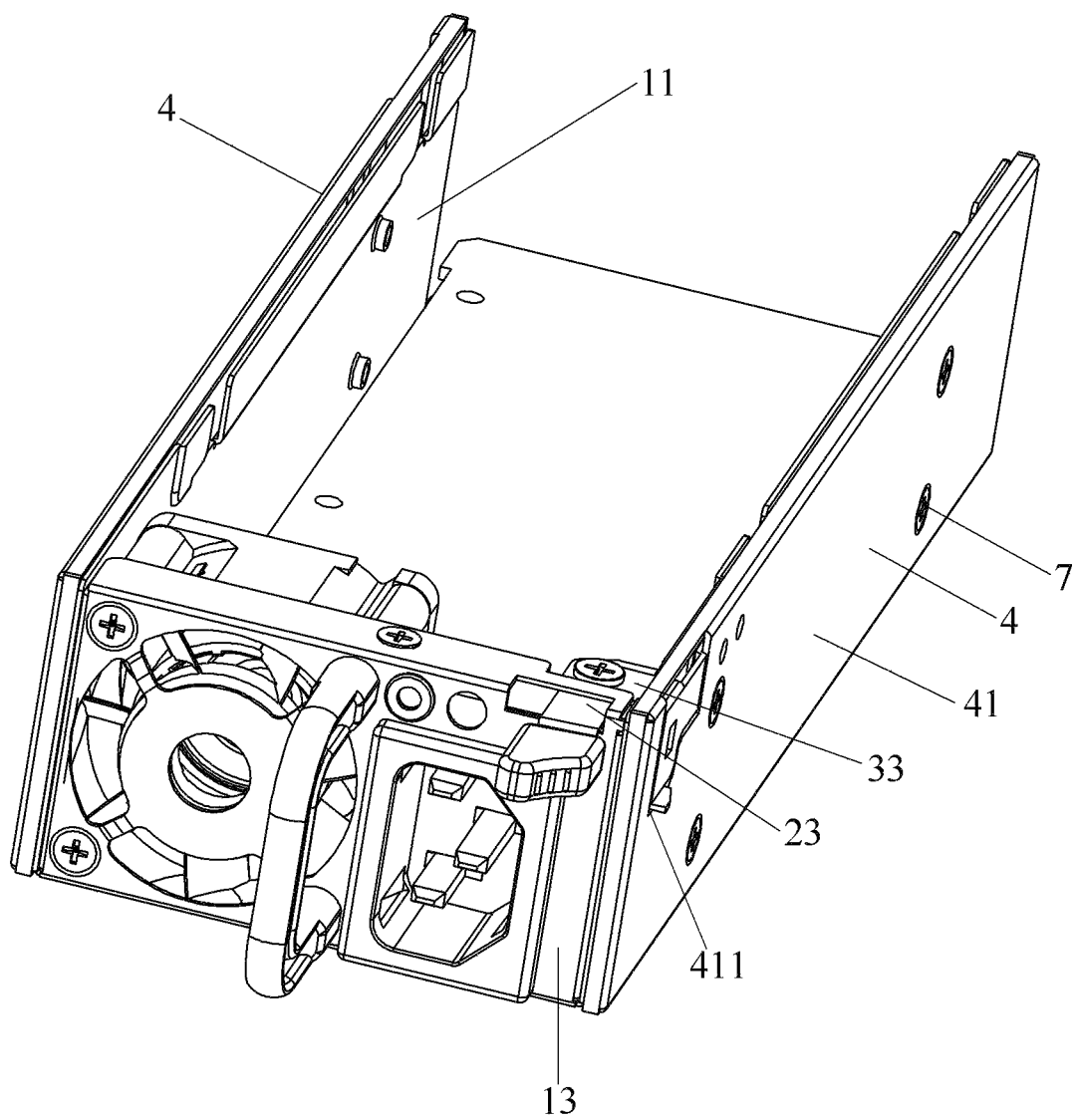
FIG. 6 is a schematic three-dimensional view showing the combination of the fixing brackets, the second elastic piece and the power supply, wherein the top plate is omitted.
Figure 7:
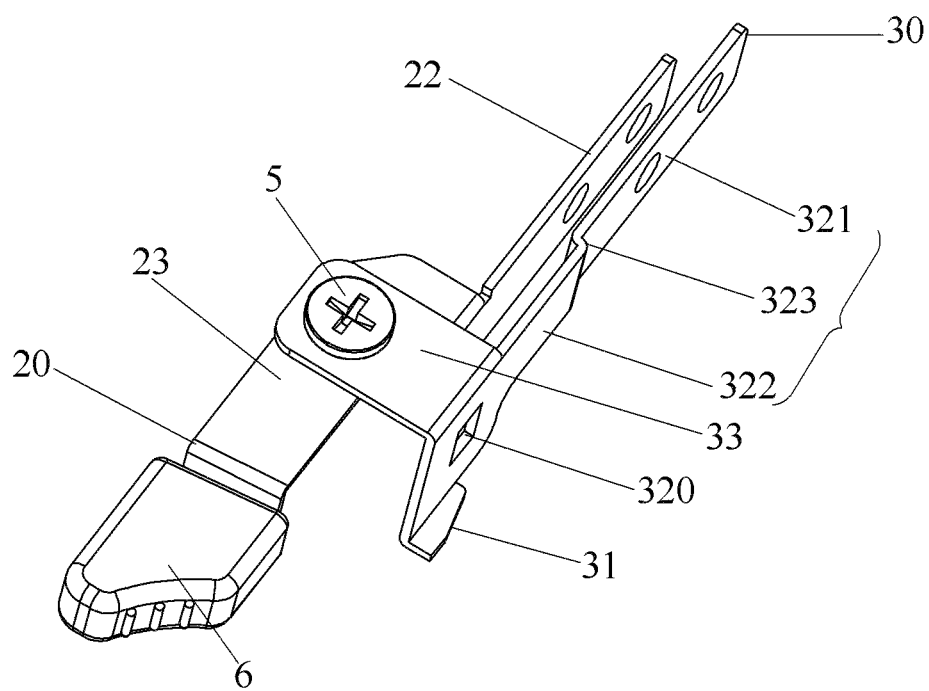
FIG. 7 is a schematic three-dimensional view of a locking spring structure according to an embodiment of the invention.
Figure 8:
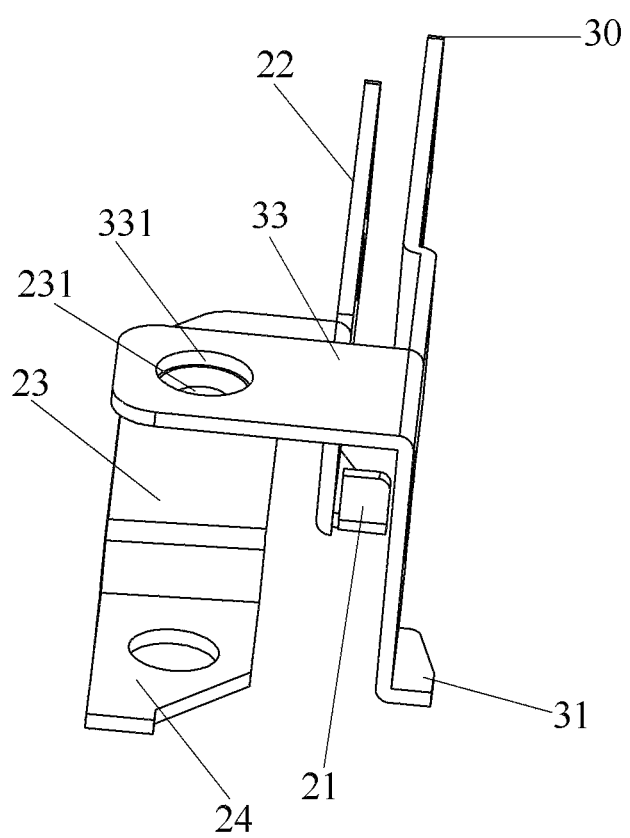
FIG. 8 is a schematic three-dimensional view of the locking spring structure of FIG. 7 without the linking screw from another perspective.

Referring to FIGS. 3 to 8, a power apparatus according to an embodiment of the invention includes a housing 1, a locking spring structure 2 and a fixing bracket 4 of a power supply. The locking spring structure 2 includes a first elastic piece 20 and a second elastic piece 30. The first elastic piece 20 is disposed inside the housing 1. One end of the first elastic piece 20 is fixed to the inner side of the housing 1, and the other end of the first elastic piece 20 extends outward to the outer side of the housing 1. The first elastic piece 20 has a first tenon 21 located outside the housing 1. The fixing bracket 4 is detachably fixed to the outer side of the housing 1. The second elastic piece 30 is installed between the housing 1 and the fixing bracket 4, and is detachably fixed to the first elastic piece 20 by a fixing member. The second elastic piece 30 has a second tenon 31 located outside the fixing bracket 4. As the other end of the first elastic piece 20 is moved inward, the first elastic piece 20 or the first elastic piece 20 and the second elastic piece 30 are driven to be elastically deformed inward, so that the first tenon 21 and the second tenon 31 are moved inward. Preferably, the other end of the first elastic piece 20 is provided with an operating member 6 made of an insulating material. When the operating member 6 is moved, the first elastic piece 20 and the second elastic piece 30 are driven to be elastically deformed inward. When the operating member 6 is loosened, the first elastic piece 20 and the second elastic piece 30 return to a normal state outward. Preferably, the fixing member is a linking screw 5. The linking screw 5 is inserted through the first elastic piece 20 and the second elastic piece 30 to achieve the purpose of detachably fixing the second elastic piece 30 to the first elastic piece 20. In addition, structures and configuration positions of the second elastic piece 30 and the second tenon 31 may be adjusted according to the structure of the chassis to which the power supply is to be installed.

Specifically, the housing 1 includes a side plate 11, a top plate 12 and an endcap 13, and the top plate 12 and the endcap 13 are adjacent to the side plate 11. The fixing bracket 4 has a base plate 41 fixed to the outer side of the side plate 11. The first elastic piece 20 has a first elastic arm 22. One end of the first elastic arm 22 is fixed on the inner wall of the side plate 11, and the other end of the first elastic arm 22 forms the first tenon 21 protruding outward. The first tenon 21 is located outside the side plate 11. The other end of the first elastic piece 20 extends outward from the endcap 13. The second elastic piece 30 has a second elastic arm 32 disposed between the side plate 11 and the base plate 41. The second tenon 31 protrudes outward from one end of the second elastic arm 32 and is located outside the base plate 41. In this embodiment, the first elastic arm 22 and the side plate 11 are riveted and fixed together. The base plate 41 and the side plate 11 are fixed together by a plurality of fixing screws 7. The housing 1 includes two side plates 11 opposite to each other, and the fixing bracket 4 is fixed on the outer side of each of the two side plates 11. At least one side plate 11 is fixed with the locking spring structure 2. The two fixing brackets 4 may be manufactured in a common mold so as to save the cost of mold retooling. It should be noted that, in this embodiment, the side plate 11 refers to a housing component located at the side when a common power supply is normally placed, and the housing includes two side plates opposite to each other. However, the invention is not limited thereto. In the invention, it is understood that the side plate and the top plate only refer to orientations shown in the drawings and are defined only for the convenience of description. For example, in other embodiments, the side plate may represent the "top plate", and the top plate may represent the "side plate".

Preferably, the second elastic arm 32 and the side plate 11 are spaced apart from each other to provide a space for the second elastic arm 32 to be elastically deformed inward. Preferably, an opening 320 facing the first tenon 21 is formed on the second elastic arm 32 to provide an evading space for the first tenon 21. In this embodiment, when the second elastic arm 32 is in the normal state (i.e., the natural state), the first tenon 21 has not entered the opening 320 yet. When the second tenon 31 is pushed inward, the second elastic arm 32 is elastically deformed inward, and the first tenon 21 enters the opening 320 to evade the second elastic arm 32.

Preferably, the other end of the second elastic arm 32 is fixed to the inner wall of the base plate 41 of the fixing bracket 4. In this way, not only does the second elastic arm 32 provide an inward elastic force more easily, but it is also more convenient, during the assembly, to install the second elastic piece 30 together with the fixing bracket 4 on the housing 1, or to detach the second elastic piece 30 together with the fixing bracket 4 from the housing 1. In this embodiment, one end of the second elastic arm 32 is riveted and fixed to the inner wall of the base plate 41. Preferably, a notch 411 is formed on the base plate 41. The second elastic arm 32 has a fixing end 321 fixed to the inner wall of the base plate 41, a movable end 322 located at the notch 411 of the base plate 41, and a bent portion 323 connecting the fixing end 321 with the movable end 322. Due to the cooperation between the notch 411 and the movable end 322, when the second tenon 31 is pushed inward, the space for the movable end 322 to be elastically deformed inward may be increased.

Preferably, the top portion of the other end of the first elastic arm 22 extends inward and then extends toward the endcap 13 to form a first connecting plate 23 substantially adjacent to and parallel to the top plate 12. The end of the first connecting plate 23 extends outward to be out of the endcap 13. The top portion of the second elastic arm 32 extends inward to be out of a second connecting plate 33 that passes through the side plate 11 to reach the inner side of the housing 1 and is aligned with the first connecting plate 23. The first connecting plate 23 and the second connecting plate 33 are respectively provided with corresponding screw holes 231 and 331. The top plate 12 is provided with a through hole 121 corresponding to the screw holes 231 and 331. As a result, during the assembly of the second elastic piece 30, the linking screw 5 may be assembled directly via the through hole 121 on the top plate 12 so as to be locked in the screw hole 231 of the first connecting plate 23 and the screw hole 331 of the second connecting plate 33. Accordingly, the second elastic piece 30 may be fixed to the first elastic piece 20 via the linking screw 5 without the need to disassemble the power supply. Specifically, in this embodiment, the end of the first connecting plate 23 is bent downward and is then bent and extended outward to form an actuating portion 24, on which the operating member 6 is formed. The second connecting plate 33 is located between the first connecting plate 23 and the top plate 12.

The assembly and use process of the power apparatus in this embodiment are described hereinafter.

First, the assembly of the power supply is performed. The first elastic piece 20 is installed and fixed to the inner side of the housing 1. Herein one end of the first elastic arm 22 is fixed to the inner wall of the side plate 11 by means of riveting, the first tenon 21 is located outside the side plate 11, and the operating member 6 is located outside the endcap 13. Then, the second elastic piece 30 is installed and fixed to the inner wall of the base plate 41 of the fixing bracket 4 by means of riveting via the fixing end 321 of the second elastic arm 32. The movable end 322 of the second elastic arm 32 is located at the notch 411 of the base plate 41. The second tenon 31 is located outside the base plate 41. Next, the combination of the fixing bracket 4 and the second elastic piece 30 is installed on the housing 1. The base plate 41 of the fixing bracket 4 is fixed to the outer side of the side plate 11 by the plurality of fixing screws 7. The second elastic arm 32 and the side plate 11 are spaced apart from each other. The opening 320 of the second elastic arm 32 is aligned with the first tenon 21. The second connecting plate 33 passes through the side plate 11 to be above the first connecting plate 23. Finally, the linking screw 5 passes through the through hole 121 on the top plate 12 and is locked in the screw hole 231 of the first connecting plate 23 and the screw hole 331 of the second connecting plate 33. The entire assembly process does not require the disassembly of the power supply. When the power supply is required to be installed to a chassis of a larger size (not shown), it is only necessary to directly fix the corresponding two fixing brackets 4 and the second elastic piece 30 to the housing 1 and the first elastic piece 20. When the power supply is required to be installed back to the original chassis or be installed to a replacement chassis, the fixing brackets 4 and the second elastic piece 30 may be simultaneously taken off after the fastening screw 5 and the fixing screw 7 are detached.

After the fixing brackets 4 and the second elastic piece 30 are fixed onto the housing 1, the power apparatus may then be integrally installed to the corresponding larger chassis. During the installation process, the inner wall of the chassis inwardly pushes against the second tenon 31, so that the second elastic piece 30 and the first elastic piece 20 are elastically deformed inward. At this time, the first tenon 21 enters the opening 320 to evade the second elastic piece 30. When the installation is in place, the corresponding slot of the inner wall of the chassis corresponds with the second tenon 31 so that the second tenon 31 is snapped outward to be locked in the corresponding slot, thereby achieving the effect of locking and positioning. When the power apparatus is required to be detached from the chassis, the operating member 6 connected onto the first elastic piece 20 is moved inward. The second elastic piece 30 is driven by the first elastic piece 20 to be elastically deformed inward, and the second tenon 31 is detached from the corresponding slot. Then, the power apparatus may be smoothly detached from inside the chassis.

Compared with existing technology, in the invention, the fixing bracket 4 is detachably fixed to the outer side of the housing 1, the second elastic piece 30 is installed between the housing 1 and the fixing bracket 4 and is detachably fixed to the first elastic piece 20 by a fixing member. The second elastic piece 30 has a second tenon 31 located outside the fixing bracket 4. As the other end of the first elastic piece 20 is moved inward, the first elastic piece 20 and the second elastic piece 30 are driven to be elastically deformed inward, so that the first tenon 21 and the second tenon 31 are moved inward. With the foregoing design, when the power supply is required to be installed to a chassis of a larger size, it is only necessary to fix the corresponding fixing brackets 4 and the second elastic piece 30 onto the housing 1, and to fix the second elastic piece 30 to the first elastic piece 20 by the fixing member at the same time. When the power supply is required to be installed back to the original chassis or be installed to a replacement chassis, it is only necessary to detach the fixing brackets 4 and the second elastic piece 30. Since there is no need to design a new housing adapted for the power supply in response to a variety of chassis of larger sizes, time for mold retooling and production costs are saved. Besides, the entire process does not require disassembling the power supply, and is thus simple and convenient.

Although the embodiments are already disclosed as above, these embodiments should not be construed as limitations on the scope of the invention. It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A locking spring structure adapted for a power apparatus, wherein the power apparatus further comprises a housing and a fixing bracket, and the fixing bracket is detachably fixed to an outer side of the housing, wherein the locking spring structure comprises a first elastic piece, a second elastic piece and a fixing member; one end of the first elastic piece is fixed to an inner side of the housing, and the other end of the first elastic piece extends outward to the outer side of the housing; the first elastic piece has a first tenon located outside the housing; the second elastic piece is installed between the housing and the fixing bracket and is detachably fixed to the first elastic piece by the fixing member; the second elastic piece has a second tenon located outside the fixing bracket; as the other end of the first elastic piece is moved inward, the first elastic piece and the second elastic piece are driven to be elastically deformed inward, so that the first tenon and the second tenon are moved inward.

2. The locking spring structure according to claim 1, wherein the fixing member is a linking screw, and the linking screw is inserted through the first elastic piece and the second elastic piece.

3. The locking spring structure according to claim 1, wherein the housing comprises a side plate, a top plate and an endcap, and the top plate and the endcap are adjacent to the side plate; the fixing bracket has a base plate fixed to an outer side of the side plate; the first elastic piece has a first elastic arm; one end of the first elastic arm is fixed to an inner wall of the side plate, and the other end of the first elastic arm forms the first tenon protruding outward; the first tenon is located outside the side plate; the other end of the first elastic piece extends outward from the endcap; the second elastic piece has a second elastic arm disposed between the side plate and the base plate; the second tenon protrudes outward from one end of the second elastic arm and is located outside the base plate.

4. The locking spring structure according to claim 3, wherein an opening aligned with the first tenon is formed on the second elastic arm.

5. The locking spring structure according to claim 3, wherein the other end of the second elastic arm is fixed to an inner wall of the base plate.

6. The locking spring structure according to claim 5, wherein a notch is formed on the base plate, and the second elastic arm has a fixing end fixed to the inner wall of the base plate, a movable end located at the notch of the base plate, and a bent portion connecting the fixing end with the movable end.

7. The locking spring structure according to claim 3, wherein a top portion of the other end of the first elastic arm extends inward and then extends toward the endcap to form a first connecting plate adjacent to and parallel to the top plate; an end of the first connecting plate extends outward to be out of the endcap; a top portion of the second elastic arm extends inward to be out of a second connecting plate that passes through the side plate to reach the inner side of the housing and is aligned with the first connecting plate; the first connecting plate is provided with a first screw hole and the second connecting plate is provided with a second screw hole corresponding to the first screw hole.

8. A power apparatus, wherein the power apparatus comprises a housing, a fixing bracket and a locking spring structure, and the fixing bracket is detachably fixed to an outer side of the housing, wherein the locking spring structure comprises a first elastic piece, a second elastic piece and a fixing member; one end of the first elastic piece is fixed to an inner side of the housing, and the other end of the first elastic piece extends outward to the outer side of the housing; the first elastic piece has a first tenon located outside the housing; the second elastic piece is installed between the housing and the fixing bracket and is detachably fixed to the first elastic piece by the fixing member; the second elastic piece has a second tenon located outside the fixing bracket; as the other end of the first elastic piece is moved inward, the first elastic piece and the second elastic piece are driven to be elastically deformed inward, so that the first tenon and the second tenon are moved inward.

9. The power apparatus according to claim 8, wherein the housing comprises a side plate, a top plate and an endcap, and the top plate and the endcap are adjacent to the side plate; the fixing bracket has a base plate fixed to an outer side of the side plate; the first elastic piece has a first elastic arm; one end of the first elastic arm is fixed to an inner wall of the side plate, and the other end of the first elastic arm forms the first tenon protruding outward; the first tenon is located outside the side plate; the other end of the first elastic piece extends outward from the endcap; the second elastic piece has a second elastic arm disposed between the side plate and the base plate; the second tenon protrudes outward from one end of the second elastic arm and is located outside the base plate.

10. The power apparatus according to claim 9, wherein the second elastic arm and the side plate are spaced apart from each other.

11. The power apparatus according to claim 9, wherein the other end of the second elastic arm is fixed to an inner wall of the base plate.

12. The power apparatus according to claim 11, wherein a notch is formed on the base plate, and the second elastic arm has a fixing end fixed to the inner wall of the base plate, a movable end located at the notch of the base plate, and a bent portion connecting the fixing end with the movable end.

13. The power apparatus according to claim 9, wherein the one end of the second elastic arm is riveted and fixed to an inner wall of the base plate.

14. The power apparatus according to claim 9, wherein a top portion of the other end of the first elastic arm extends inward and then extends toward the endcap to form a first connecting plate adjacent to and parallel to the top plate; an end of the first connecting plate extends outward to be out of the endcap; a top portion of the second elastic arm extends inward to be out of a second connecting plate that passes through the side plate to reach the inner side of the housing and is aligned with the first connecting plate; the first connecting plate is provided with a first screw hole and the second connecting plate is provided with a second screw hole corresponding to the first screw hole, and the first screw hole and the second screw hole are configured to cooperates with a linking screw; the top plate is provided with a through hole that is corresponding to the first screw hole and the second screw hole, and is configured for the linking screw to pass through.

15. The power apparatus according to claim 14, wherein the second connecting plate is located between the first connecting plate and the top plate.

16. The power apparatus according to claim 9, wherein the base plate and the side plate are fixed together by a plurality of fixing screws.

17. The power apparatus according to claim 9, wherein the number side plate of the housing is two and the two side plates are opposite to each other; the number of the fixing bracket is two, and an outer side of each of the two side plates is fixed with one of the two fixing brackets; at least one of the two side plates is fixed with the locking spring structure; the two fixing brackets are manufactured in a common mold.

* * * * *